United States Patent
Koide et al.

(10) Patent No.: US 10,573,508 B2
(45) Date of Patent: Feb. 25, 2020

(54) SURFACE TREATMENT APPARATUS AND METHOD FOR SEMICONDUCTOR SUBSTRATE

(71) Applicant: TOSHIBA MEMORY CORPORATION, Tokyo (JP)

(72) Inventors: Tatsuhiko Koide, Yokkaichi (JP);
Shinsuke Kimura, Yokkaichi (JP);
Yoshihiro Ogawa, Yokkaichi (JP);
Hisashi Okuchi, Yokohama (JP);
Hiroshi Tomita, Yokohama (JP)

(73) Assignee: Toshiba Memory Corporation, Tokyo (JP)

( * ) Notice: Subject to any disclaimer, the term of this patent is extended or adjusted under 35 U.S.C. 154(b) by 218 days.

(21) Appl. No.: 14/836,881

(22) Filed: Aug. 26, 2015

(65) Prior Publication Data

US 2015/0371845 A1 Dec. 24, 2015

Related U.S. Application Data

(62) Division of application No. 12/887,332, filed on Sep. 21, 2010, now abandoned.

(30) Foreign Application Priority Data

Dec. 15, 2009 (JP) .................................. 2009-284347

(51) Int. Cl.
*H01L 21/02* (2006.01)
*H01L 21/3065* (2006.01)
(Continued)

(52) U.S. Cl.
CPC .... *H01L 21/02057* (2013.01); *H01L 21/3065* (2013.01); *H01L 21/31* (2013.01); *H01L 21/31116* (2013.01); *H01L 21/324* (2013.01)

(58) Field of Classification Search
None
See application file for complete search history.

(56) References Cited

U.S. PATENT DOCUMENTS 5,549,212 A * 8/1996 Kanoh .............. G02F 1/133553
216/11
6,645,702 B1 * 11/2003 Rangarajan ............. G03F 7/265
257/E21.026

(Continued)

FOREIGN PATENT DOCUMENTS

EP 1 696 476 A2 8/2006
JP 05-299336 11/1993

(Continued)

OTHER PUBLICATIONS

Office Action issued by the Taiwanese Intellectual Property Office dated Mar. 23, 2015, for Taiwanese Patent Application No. 099130213, and English-language translation thereof.

(Continued)

*Primary Examiner* — Mikhail Kornakov
*Assistant Examiner* — Pradhuman Parihar
(74) *Attorney, Agent, or Firm* — Finnegan, Henderson, Farabow, Garrett & Dunner, L.L.P.

(57) ABSTRACT

In one embodiment, a surface treatment apparatus for a semiconductor substrate includes a holding unit, a first supply unit, a second supply unit, a third supply unit, a drying treatment unit, and a removal unit. The holding unit holds a semiconductor substrate with a surface having a convex pattern formed thereon. The first supply unit supplies a chemical solution to the surface of the semiconductor substrate, to perform cleaning and oxidation. The second supply unit supplies pure water to the surface of the semiconductor substrate, to rinse the semiconductor substrate. The third supply unit supplies a water repelling agent to the surface of the semiconductor substrate, to form a water (Continued)

repellent protective film on the surface of the convex pattern. The drying treatment unit dries the semiconductor substrate. The removal unit removes the water repellent protective film while making the convex pattern remain.

20 Claims, 13 Drawing Sheets

(51) Int. Cl.
*H01L 21/31* (2006.01)
*H01L 21/311* (2006.01)
*H01L 21/324* (2006.01)

(56) References Cited

U.S. PATENT DOCUMENTS

| | | | |
|---|---|---|---|
| 6,698,439 | B2 | 3/2004 | Kamikawa et al. |
| 7,482,281 | B2 | 1/2009 | Fujii et al. |
| 2004/0211756 | A1 | 10/2004 | Kume et al. |
| 2004/0226582 | A1* | 11/2004 | Satoshi ............... B08B 3/08 134/25.4 |
| 2005/0176254 | A1 | 8/2005 | Takeishi et al. |
| 2005/0202618 | A1* | 9/2005 | Yagishita ............ H01L 21/84 438/197 |
| 2006/0194429 | A1* | 8/2006 | Hashimoto ......... H01L 27/105 438/625 |
| 2007/0077768 | A1 | 4/2007 | Fujii et al. |
| 2007/0111541 | A1 | 5/2007 | Endo et al. |
| 2007/0295365 | A1 | 12/2007 | Miya et al. |
| 2008/0008973 | A1* | 1/2008 | Goto .................. G03F 7/3021 430/432 |
| 2008/0182421 | A1* | 7/2008 | Nishimura ......... H01L 21/3065 438/717 |
| 2008/0230101 | A1 | 9/2008 | Hayashi |
| 2008/0295868 | A1 | 12/2008 | Nakamura et al. |
| 2009/0084754 | A1 | 4/2009 | Hayamizu et al. |
| 2009/0117692 | A1* | 5/2009 | Koyama ............ H01L 21/2007 438/164 |
| 2009/0311874 | A1 | 12/2009 | Tomita et al. |
| 2010/0075504 | A1 | 3/2010 | Tomita et al. |
| 2010/0122711 | A1* | 5/2010 | Ryan .................... C11D 7/08 134/2 |
| 2010/0261349 | A1* | 10/2010 | van Schravendijk ........................ H01L 21/3105 438/675 |

FOREIGN PATENT DOCUMENTS

| | | |
|---|---|---|
| JP | 5-326464 | 12/1993 |
| JP | 07-142349 | 6/1995 |
| JP | 07-273083 | 10/1995 |
| JP | 2006-192358 | 7/2006 |
| JP | 3866130 | 10/2006 |
| JP | 2007-140075 | 6/2007 |
| KR | 10-2006-0024832 | 3/2006 |

OTHER PUBLICATIONS

Koide et al.; "Method of Manufacturing Semiconductor Device", U.S. Appl. No. 12/715,727, filed Mar. 2, 2010.
Notification of Reasons for Rejection issued by the Korean Patent Office dated Aug. 31, 2011, for Korean Patent Application No. 10-2010-88288, and English-language translation thereof.
Notification of Reasons for Rejection issued by the Korean Intellectual Property Office dated Aug. 29, 2012, for Korean Patent Application No. 10-2010-88288, and English-language translation thereof.
Notification of Reason for Rejection, issued by the Japanese Patent Office dated Apr. 2, 2013, for Japanese Patent Application No. 2009-284347, and English-language translation thereof.

\* cited by examiner

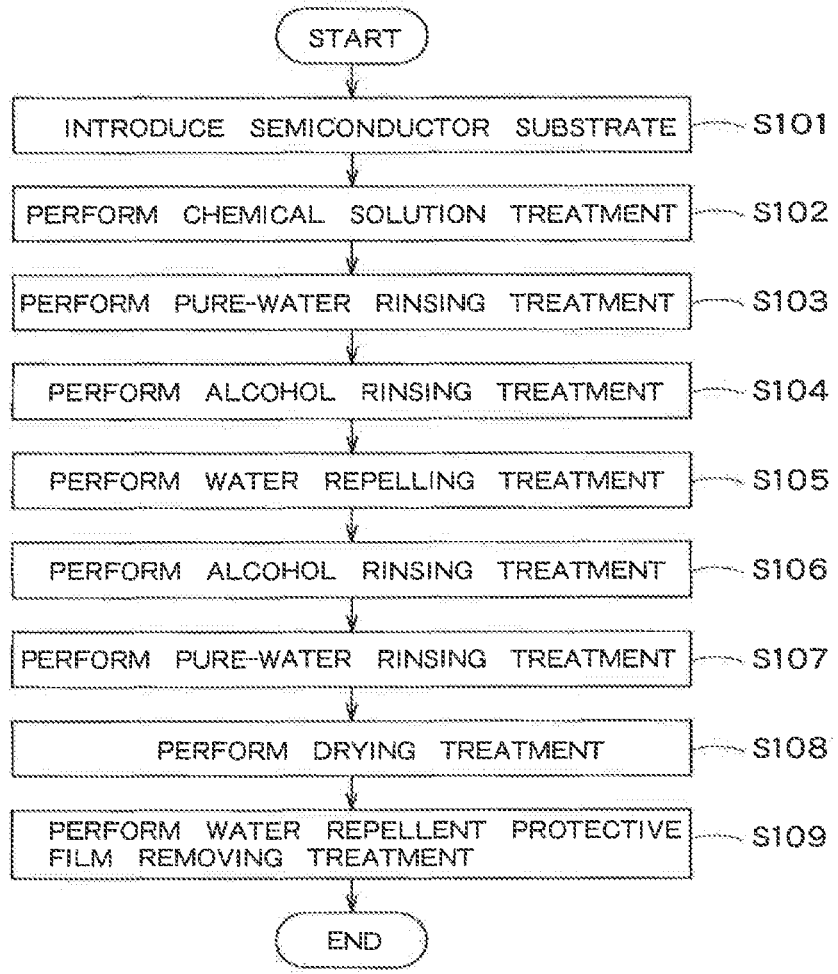
F I G. 2

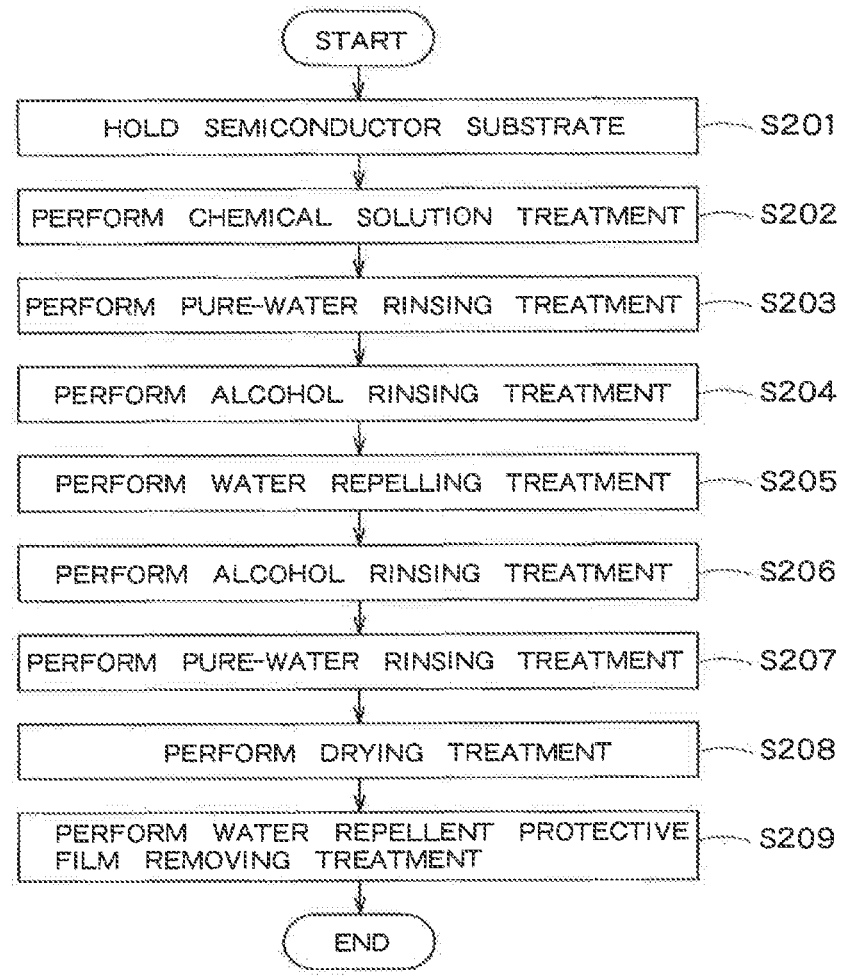
F I G. 6

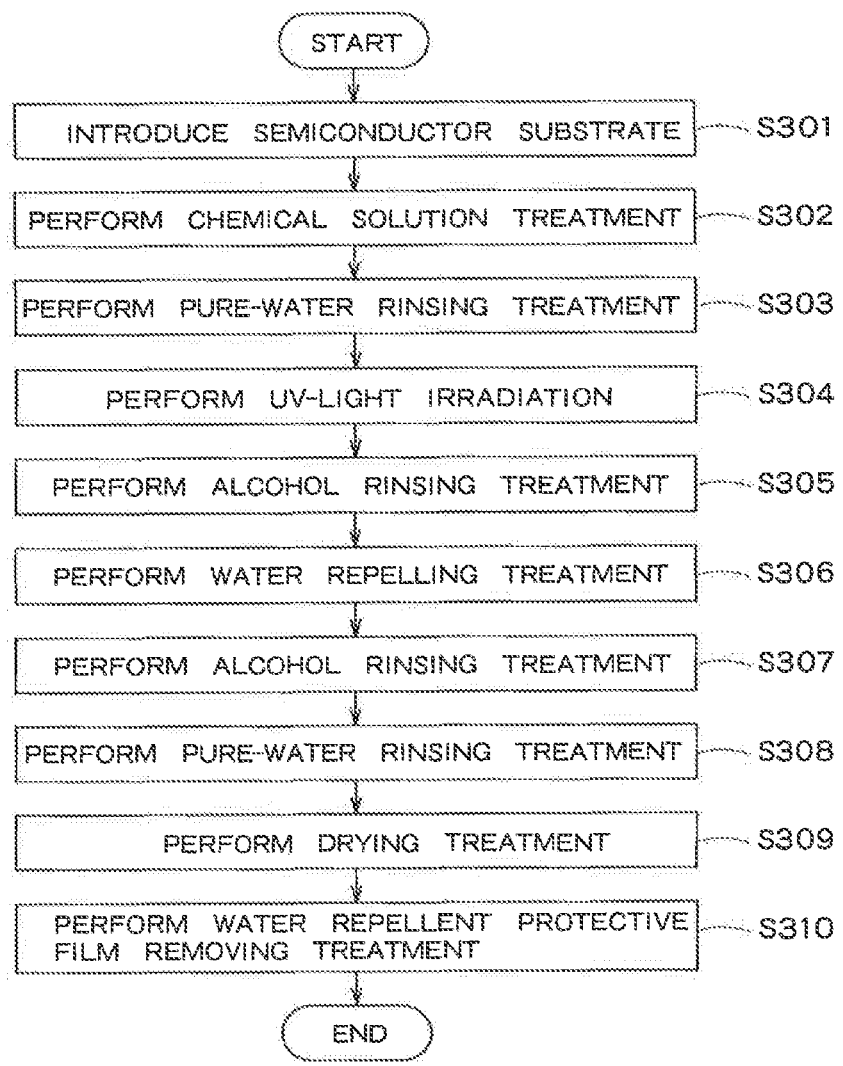
F I G. 8

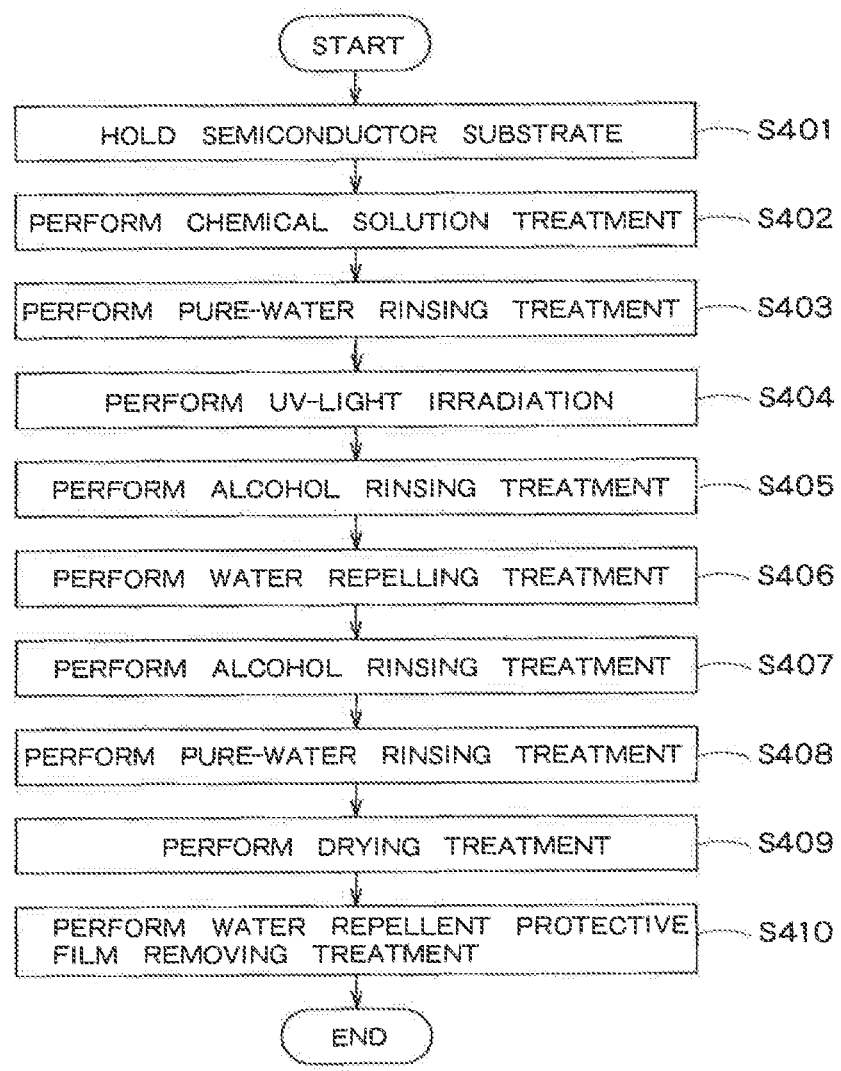
F I G. 10

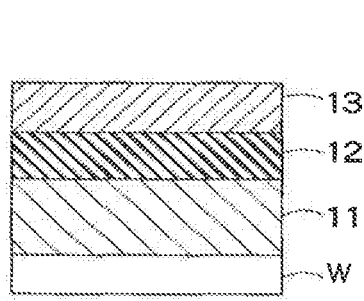
F I G. 11A
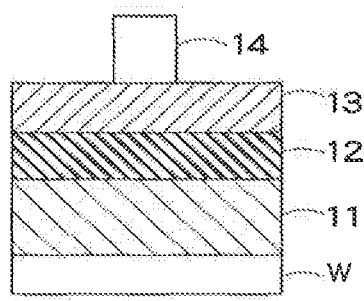
F I G. 11B
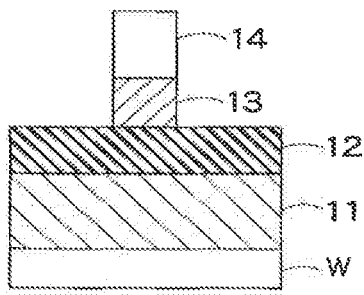
F I G. 11C
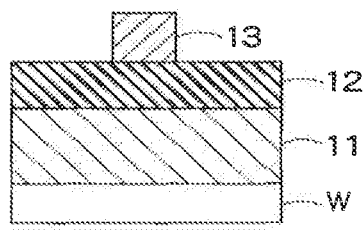
F I G. 11D
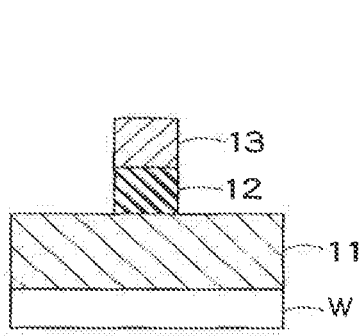
F I G. 12A
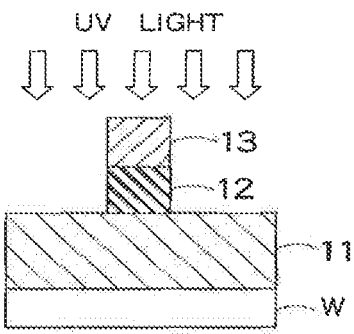
F I G. 12B
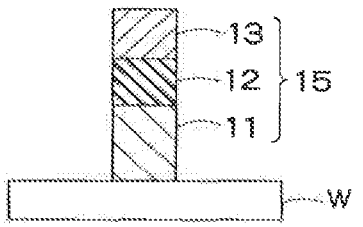
F I G. 12C

SURFACE TREATMENT APPARATUS AND METHOD FOR SEMICONDUCTOR
SUBSTRATE

CROSS-REFERENCE TO RELATED APPLICATIONS

This application is a divisional application of U.S. patent application Ser. No. 12/887,332, filed Sep. 21, 2010, and claims benefit of priority from the Japanese Patent Application No. 2009-284347, filed on Dec. 15, 2009, the entire contents of which are incorporated herein by reference.

FIELD

Embodiments described herein relate generally to a surface treatment apparatus and a surface treatment method for a semiconductor substrate.

BACKGROUND

The process of manufacturing a semiconductor device includes various processes, such as a lithography process, an etching process and an ion implantation process. After completion of each process, a cleaning process and a drying process for removing impurities and residues remaining on a wafer surface to clean the wafer surface are performed before the transfer to the next process.

In recent years, as progress has been made in miniaturization of elements, a problem has arisen in that, during development and drying of resist patterns after the lithography process (exposure and development), the resist patterns are collapsed due to capillarity. To solve such a problem, a method of making the surfaces of resist patterns water-repellent to decrease capillary forces acting between the resist patterns and developer as well as between the resist patterns and pure water for rinsing has been proposed (see, e.g., Japanese Patent Application Laid-Open No. 7-142349). Under this method, an organic matter is adhered onto the surfaces of resist patterns; however, the organic matter is removed together with the resist patterns in the etching process after the lithography process.

For example, in cleaning treatment of a wafer after the etching process, a chemical for the cleaning treatment is supplied onto the surface of the wafer, and then pure water is supplied to perform rinsing. After the rinsing, drying is performed which removes the pure water remaining on the wafer surface and dries the wafer.

As the method of performing the drying, there is known a method which uses isopropyl alcohol (IPA) and substitutes IPA for pure water on a wafer to dry the wafer (see, e.g., Japanese Patent No 3866130). However, there has been a problem in that, during the drying, the actual device patterns formed on the wafer are collapsed by the surface tension of a liquid. Even with hydrofluoroether (HFE) having lower surface tension than IPA, it has been difficult: to restrain the pattern collapse.

To solve such problems, supercritical drying in which the surface tension becomes zero has been proposed. However, it is difficult to apply the supercritical drying to mass production processes. Further, the supercritical drying has had a problem in that, when moisture or the like is carried into a chamber which provides a supercritical atmosphere, collapse of patterns cannot be prevented.

BRIEF DESCRIPTION OF THE DRAWINGS

FIG. 2 is a flowchart explaining a surface treatment method of a semiconductor substrate according to the first embodiment;

FIG. 6 is a flowchart explaining a surface treatment method of a semiconductor substrate according to the second embodiment;

FIG. 8 is a flowchart explaining a surface treatment method of a semiconductor substrate according to the third embodiment;

FIG. 10 is a flowchart explaining a surface treatment method of a semiconductor substrate according to the fourth embodiment;

FIG. 11A is a sectional view explaining a surface treatment method for a semiconductor substrate according to a modification;

FIG. 11B is a sectional view showing a step subsequent to FIG. 11A;

FIG. 11C is a sectional view showing a step subsequent to FIG. 11B;

FIG. 11D is a sectional view showing a step subsequent to FIG. 11C;

FIG. 12A is a sectional view showing a step subsequent to FIG. 11D;

FIG. 12B is a sectional view showing a step subsequent to FIG. 12A;

FIG. 12C is a sectional view showing a step subsequent to FIG. 12B;

DETAILED DESCRIPTION

In one embodiment, a surface treatment apparatus for a semiconductor substrate includes a holding unit, a first supply unit, a second supply unit, a third supply unit, a drying treatment unit, and a removal unit. The holding unit holds a semiconductor substrate with a surface having a convex pattern formed thereon. The first supply unit supplies a chemical solution to the surface of the semiconductor substrate, to perform cleaning and oxidation. The second supply unit supplies pure water to the surface of the semiconductor substrate, to rinse the semiconductor substrate. The third supply unit supplies a water repelling agent to the surface of the semiconductor substrate, to form a water repellent protective film on the surface of the convex pattern. The drying treatment unit dries the semiconductor substrate. The removal unit removes the water repellent protective film while making the convex pattern remain.

An object to be performed in the washing process in the manufacturing process of a semiconductor device is to return a semiconductor substrate surface to a clean surface state without generating any defect (missing pattern, scratch, thinned pattern, dug substrate, or the like) in a fine pattern structure formed on a semiconductor substrate. Specifically, target matters to be washed includes resist material used in a lithography process, a reaction by-product (residue) remaining on a semiconductor wafer surface in a dry etching process, and metallic impurity, organic contaminant or the like, these processes are generally employed in a semiconductor manufacturing process. If the wafer is flown to the following manufacturing process while leaving the target materials to be washed, a device manufacturing yield ratio has to be lowered.

Accordingly, the cleaning process has an important role of forming a clean semiconductor wafer surface after cleaning without generating any defect (missing pattern, scratch, thinned pattern, dug substrate, or the like) in a fine pattern structure formed on the semiconductor substrate. As an element is miniaturized, cleanliness demanded in the cleaning process becomes higher.

On the other hand, in a recent structure in which a convex fine pattern of high aspect is provided (for example, a structure having pattern size of 30 nm or less, and an aspect ratio of 10 or more), since hydrophobicity is insufficient only by applying hydrophobic technique which is used in the resist process, it has been difficult to suppress collapse of the pattern. Further, there has been a problem with this method that the pattern surface is contaminated. In accordance with the following embodiments, it is possible to achieve higher hydrophobic surface than the conventional one and to suppress the pattern collapse, while keeping the pattern surface clean, with respect to the structure having the convex fine pattern of high aspect.

First Embodiment

Figure 1:
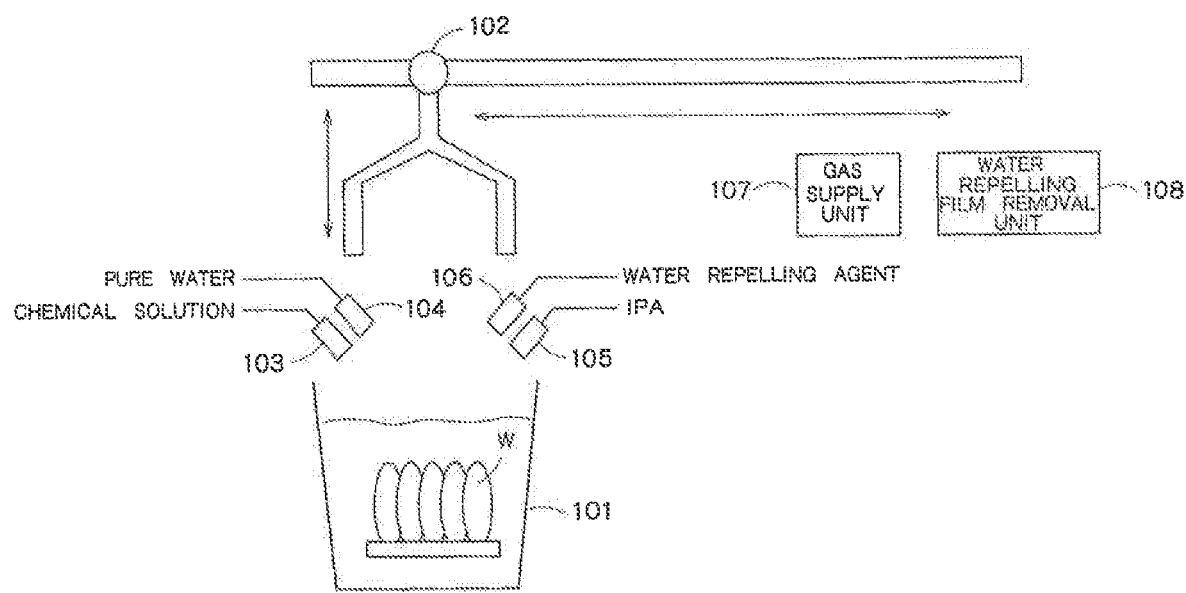
FIG. 1 is a diagram showing a schematic configuration of a surface treatment apparatus of a semiconductor substrate according to a first embodiment of the present invention.

FIG. 1 shows a schematic configuration of a surface treatment apparatus for a semiconductor substrate according to a first embodiment of the present invention. The surface treatment apparatus includes a treatment bath 101, a carrier unit 102, a chemical solution supply unit 103, a pure water supply unit 104, an IPA supply unit 105, a water repelling agent supply unit 106, a gas supply unit 107, and a water repelling film removal unit 108. This surface treatment apparatus is a batch type apparatus that washes and dries a plurality of semiconductor substrates in block.

The carrier unit 102 holds and carries a semiconductor substrate W on the surface of which a convex pattern is formed. For example, the carrier unit 102 introduces the semiconductor substrate W into the treatment bath 101, and carries the semiconductor substrate W to the water repelling film removal unit 108.

The chemical solution supply unit 103 supplies the treatment bath 101 with a chemical solution for washing the semiconductor substrate W. The chemical solution supply unit 103 supplies a highly oxidative chemical solution, such as a solution obtained by increasing a temperature of a mixed solution (SPM) of sulfuric add and hydrogen peroxide to 80° C. or higher, or sulfuric add. The chemical solution supply unit 103 may be provided with a heating mechanism (e.g. heater, etc.) for increasing a temperature of the chemical solution.

The pure water supply unit 104 supplies the treatment bath 101 with pure water for rinsing the semiconductor substrate W.

The IPA supply unit 105 supplies the treatment bath 101 with IPA (isopropyl alcohol) for rinsing the semiconductor substrate W.

The water repelling agent supply unit 106 supplies the treatment bath 101 with a water repelling agent for forming a water repellent protective film on the surface of a convex pattern formed on the semiconductor substrate W. The water repelling agent is, for example, a silane coupling agent. The silane coupling agent has a hydrolytic group having an affinity for and reactivity to an inorganic material in a molecule, and an organic functional group that forms a chemical bond with an organic material, and for example, hexamethyldisilazane (HMDS), tetramethyl silyl diethylamine (TMSDEA), or the like can be applied. Generation of an ester-reaction of the silane coupling agent leads to formation of a water repellent protective film.

The gas supply unit (drying treatment unit) 107 can supply dry air so as to dry the semiconductor substrate W.

The treatment bath 101 can reserve and discharge a liquid supplied from the chemical solution supply unit 103, the pure water supply unit 104, the IPA supply unit 105, the water repelling agent supply unit 106, or the like. The treatment bath 101 is preferably made up of a Teflon (registered trademark)-based material in order to be capable of treating the highly oxidative chemical solution supplied from the chemical solution supply unit 103.

The water repelling film removal unit 108 can remove the water repellent protective film formed on the convex pattern surface on the semiconductor substrate W, and for example, a dry aching, ozone-gas treatment, UV light irradiation, or the like is performed.

A method for performing surface treatment on a semiconductor substrate with use of such a surface treatment apparatus will be described using a flowchart shown in FIG. 2.

(Step S101) The carrier unit 102 introduces the semiconductor substrate W processed with the convex pattern into the treatment bath 101. This convex pattern is, for example, a line-and-space pattern. The convex pattern is, for example, a high aspect ratio structure having an aspect ratio of 10 or more. The convex pattern is formed, for example, by RIE (Reactive Ion Etching) method.

(Step S102) A highly oxidative chemical solution is supplied from the chemical solution supply unit 103 to the treatment bath 101, and the semiconductor substrate W is washed. Thereby, a residue generated due to the processing of the convex pattern on the semiconductor substrate W can be removed, and also, the surface can be oxidized.

(Step S103) Pure water is supplied from the pure water supply unit 104 to the treatment bath 101, and the semiconductor substrate W is rinsed so that the chemical solution component used in Step 102 is removed.

(Step S104) IPA is supplied from the IPA supply unit 105 to the treatment bath 101, to perform alcohol rinsing treatment for replacing pure water by IPA.

(Step S105) A silane coupling agent is supplied from the water repelling agent supply unit 106 to the treatment bath 101, and a protective film with low wettability (water repellent protective film) is formed on the semiconductor substrate W (convex pattern) surface.

Generation of a silylation reaction between an OH group of the semiconductor substrate W (convex pattern) and R—Si—OH of the silane coupling agent leads to formation of R—Si—O on the semiconductor substrate W (convex pattern) surface. The water repellent protective film is obtained by a molecular structure with an R group turned outward among R—Si—O.

Therefore, the larger the number of OH groups on the semiconductor substrate W (convex pattern), the easier the water repellent protective film is to form and the higher the water repellency of the semiconductor substrate W (convex pattern) surface becomes. In the present embodiment, with the highly oxidative chemical solution used at the time of washing treatment in Step S102, the number of OH groups on the semiconductor substrate W (convex pattern) is large.

(Step S106) IPA is supplied from the IPA supply unit 105 to the treatment bath 101, and the silane coupling agent is replaced by IPA.

(Step S107) Pure water is supplied from the pure water supply unit 104 to the treatment bath 101, and an IPA residue is rinsed off.

(Step S108) The carrier unit 102 pulls up the semiconductor substrate W from the treatment bath 101, and the gas supply unit 107 supplies the semiconductor substrate W with dry air for evaporation-drying.

Since the pattern formed on the semiconductor substrate W is covered by the water repellent protective film, a contact angle θ of pure water is large (close to 90°).

Figure 3:
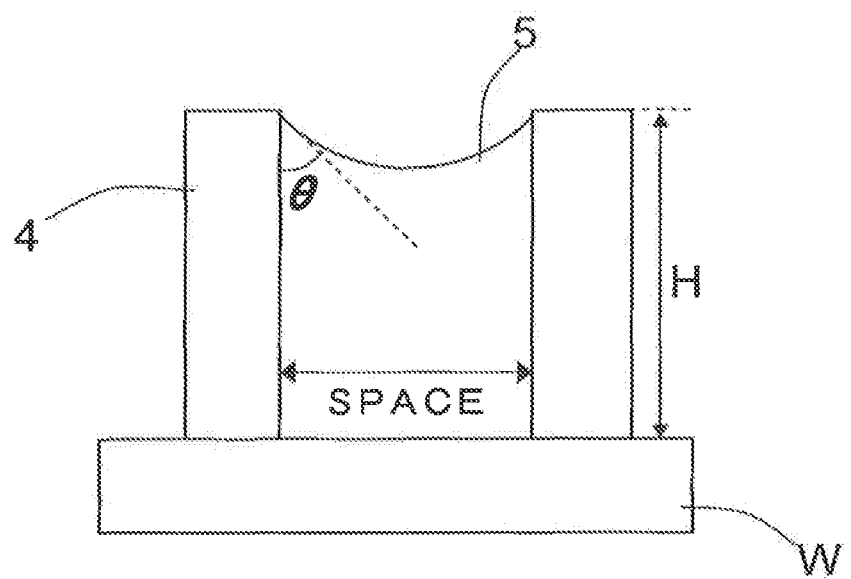
FIG. 3 is a view showing a surface tension of liquid to the pattern.

FIG. 3 shows a state where a part of patterns 4 formed on the semiconductor substrate W is wet with a liquid 5. When a space between the patterns 4 is taken as "Space" and a surface tension of the liquid 5 as γ, power P that is applied to the pattern 4 is:

$$P = 2 \times \gamma \times \cos \theta \cdot H / \text{Space} \quad \text{(Equation 1)}$$

It is found that, with θ being close to 90°, cos θ is close to zero, and hence the power P of the liquid, which acts on the pattern at the time of drying treatment, is small. It is thereby possible to prevent collapse of the pattern at the time of the drying treatment.

(Step S109) The carrier unit 102 carries the semiconductor substrate W to the water repelling film removal unit 108. The water repelling film removal unit 108 removes the water repellent protective film formed on the convex pattern surface on the semiconductor substrate W while making the convex pattern remain.

Figure 4A:
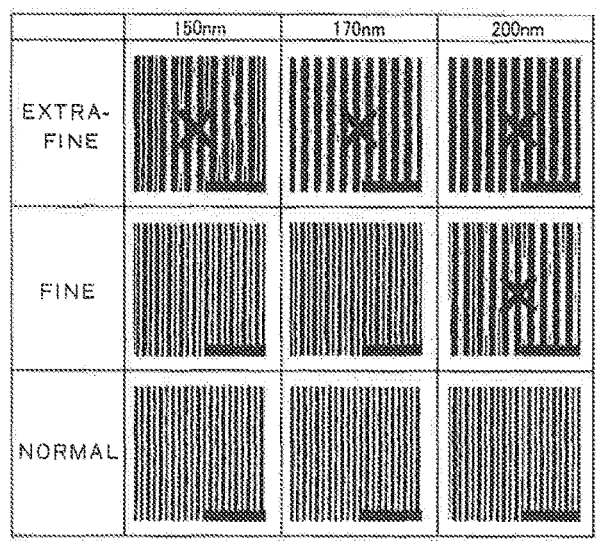
FIG. 4A is a view showing a state of a pattern after a drying process in case where a water repellent protective film is not formed.
Figure 4B:
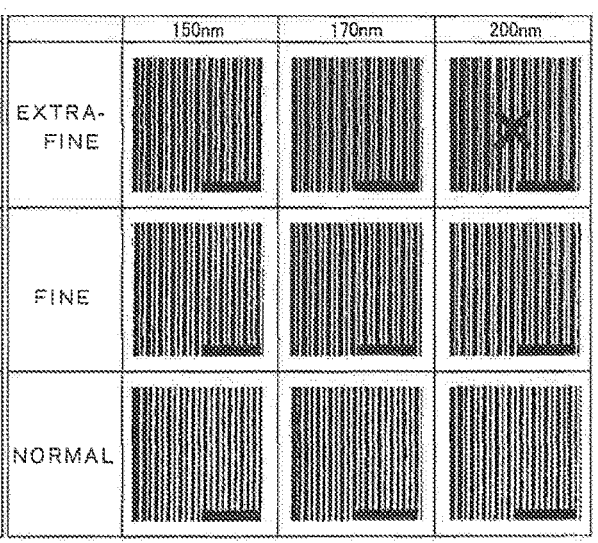
FIG. 4B is a view showing a state of a pattern after a drying process in case where a water repellent protective film is formed.

FIG. 4A shows states of the pattern after the drying treatment in the case of not forming the water repellent protective film, and FIG. 4B shows states of the pattern after the drying treatment in the case of forming the water repellent protective film as thus described. Surface treatment was performed on patterns with three kinds of line heights: 150 nm, 170 nm and 200 nm, and three kinds of pattern widths: normal, fine and extra-fine (normal>fine>extra-fine).

As seen from FIG. 4A, in the case of not forming the protective film, pattern collapse occurred in the pattern with the extra-fine line width and the line heights of any of 150 nm, 170 nm and 200 nm. Further, the pattern collapse also occurred in the pattern with the fine line width and the 200 nm line height.

On the other hand, as seen from FIG. 4B, when the water repellent protective film was formed, it was possible to prevent pattern collapse except for the pattern with the extra-fine line width and the 200-nm line height. It is found that formation of the water repellent protective film can prevent pattern collapse due to washing/drying even in a pattern with a high aspect ratio, so as to improve a collapse margin.

As thus described, forming (and forcibly oxidizing) the semiconductor substrate surface with use of the highly oxidative chemical solution and then forming the water repellent protective film on the substrate surface can prevent collapse of the extra-fine pattern at the time of the drying treatment.

Second Embodiment

Figure 5:
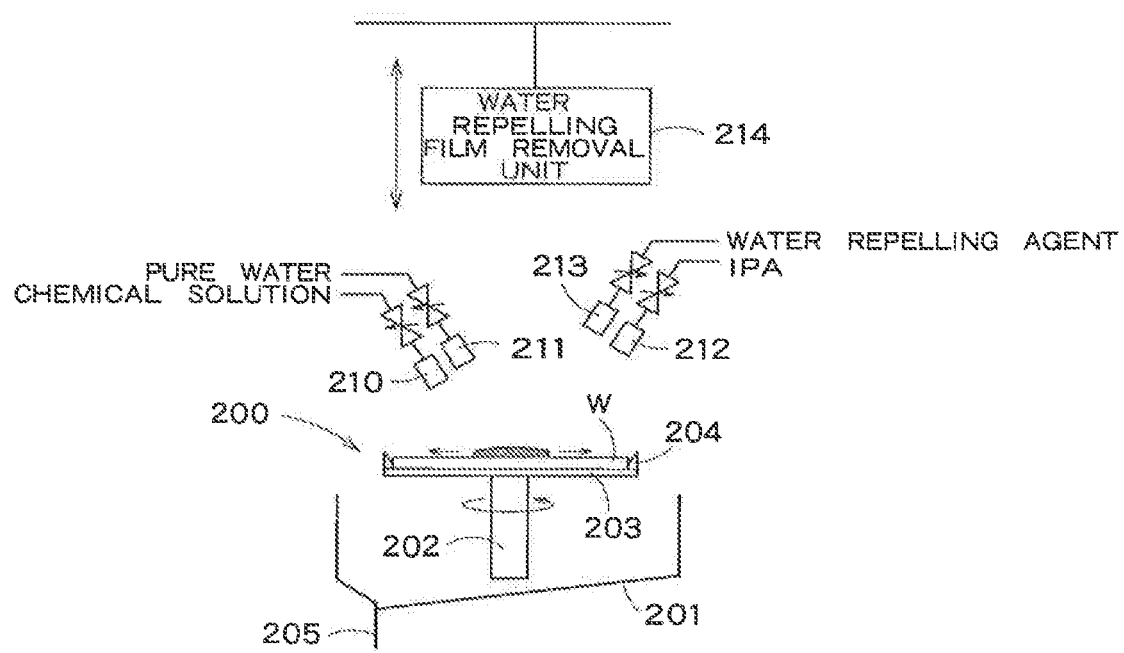
FIG. 5 is a diagram showing a schematic configuration of a surface treatment apparatus of a semiconductor substrate according to a second embodiment of the present invention.

FIG. 5 shows a schematic configuration of a surface treatment apparatus for a semiconductor substrate according to a second embodiment of the present invention. The surface treatment apparatus includes a substrate holding/rotation unit 200, a chemical solution supply unit 210, a pure water supply unit 211, an WA supply unit 212, a water repelling agent supply unit 213, and a water repelling film removal unit 214. This surface treatment apparatus is a single type apparatus that supplies a semiconductor substrate with a treatment solution, to treat the substrate on a one-by-one basis.

The substrate holding/rotation unit 200 has a spin cup 201, which constitutes a process chamber, a rotation axis 202, a spin base 203, and a chuck pin 204. The rotation axis 202 extends in a substantially vertical direction, and the spin base 203 in disc shape is mounted on the top of the rotation axis 202. The rotation axis 202 and the spin base 203 can be rotated by a motor not shown in the figure.

The chuck pin 204 is provided around the edge of the spin base 203. By the chuck pin 204 nipping a substrate (wafer) W, the substrate holding/rotation unit 200 can rotate the substrate W while holding it almost horizontally When a liquid is supplied from the chemical solution supply unit 210, the pure water supply unit 211, the WA supply unit 212 or the water repelling agent supply unit 213, the liquid expands in a radial direction of semiconductor the substrate W to the vicinity of the rotational center of the substrate W. Further, the substrate holding/rotation unit 200 can perform spin-drying on the semiconductor substrate W. An extra liquid scattered in the radial direction of the substrate W is captured in the spin cup 201, and discharged through a waste tube 205.

The chemical solution supply unit 210 supplies the semiconductor substrate W held in the substrate holding/rotation unit 200 with a chemical solution for washing the semiconductor substrate W. The chemical solution supply unit 210 supplies a highly oxidative chemical solution, such as a solution obtained by heating a temperature of a mixed solution (SPM) of sulfuric acid and hydrogen peroxide to 80 (C or higher, or sulfuric acid.

The pure water supply unit 211 supplies the semiconductor substrate W held in the substrate holding/rotation unit 200 with pure water for rinsing the semiconductor substrate W.

The IPA supply unit 212 supplies the semiconductor substrate W held in the substrate holding/rotation unit 200 with IPA for rinsing the semiconductor substrate W.

The water repelling agent supply unit 213 supplies the semiconductor substrate W held in the substrate holding/rotation unit 200 with a water repelling agent. The water repelling agent is a chemical solution that forms a water repellent protective film on the surface of a convex pattern, formed on the surface of the semiconductor substrate W, to make the pattern surface water repellent, and for example, hexamethyldisilazane (HMDS), tetramethyl silyl diethylamine (TMSDEA), or the like can be applied.

The water repelling film removal unit 214 can remove the water repellent protective film while making the convex pattern remain. The water repelling film removal unit 214 removes the water repellent protective film, for example, by UV-light irradiation. The water repelling film removal unit 214 is provided above the substrate holding/rotation unit 200, and is vertically movable.

A carrier unit 215 carries the semiconductor substrate W to the substrate holding/rotation unit 200.

A method for performing surface treatment on a semiconductor substrate with use of such a surface treatment apparatus will be described using a flowchart shown in FIG. 6. It is to be noted that operations of the substrate holding/rotation unit 200, the chemical solution supply unit 210, the pure water supply unit 211, the IPA supply unit 212, the water repelling agent supply unit 213 and the water repelling film removal unit 214 can be controlled by a controlling unit not shown in the figure.

(Step S201) A semiconductor substrate W to be treated, having a plurality of convex patterns in a predetermined area of its surface, is carried by the carrier unit (not shown), and held in the substrate holding/rotation unit 200. The convex pattern is, for example, a line-and-space pattern. At least part of the convex pattern may be formed by a silicon-containing film. The convex pattern is formed, for example, by RIE (Reactive Ion Etching) method.

(Step S202) The semiconductor substrate W is rotated at a predetermined rotational speed, and the chemical solution is supplied from the chemical solution supply unit 210 to the vicinity of the rotational center of the semiconductor substrate W surface. The chemical solution is a highly oxidative chemical solution. Upon receipt of centrifugal force generated by rotation of the semiconductor substrate W, the chemical solution reaches all parts of the semiconductor substrate W surface, and chemical-solution (washing) treatment is performed on the semiconductor substrate W.

(Step S203) Pure water is supplied from the pure water supply unit 211 to the vicinity of the rotational center of the semiconductor substrate W surface. Upon receipt of centrifugal force generated by rotation of the semiconductor substrate W, the pure water reaches all parts of the semiconductor substrate W surface. Thereby, pure-water rinsing treatment is performed in which the chemical solution remaining on the semiconductor substrate W surface is rinsed off by the pure water. This can remove the processing residue and oxidize the substrate surface.

(Step S204) Alcohol such as IPA is supplied from the IPA supply unit 212 to the vicinity of the rotational center of the semiconductor substrate W surface. Upon receipt of centrifugal force generated by rotation of the semiconductor substrate W, IPA reaches all parts of the semiconductor substrate W surface. Thereby, alcohol rinsing treatment is performed in which the pure water remaining on the semiconductor substrate W surface is replaced by IPA.

(Step S205) A water repelling agent is supplied from the water repelling agent supply unit 213 to the vicinity of the rotational center of the semiconductor substrate W surface. The water repelling agent is, for example, a silane coupling agent.

Upon receipt of centrifugal force generated by rotation of the semiconductor substrate W, the silane coupling agent reaches all parts of the semiconductor substrate W surface. Thereby, a protective film with low wettability (water repellent protective film) is formed on the convex pattern surface. This water repellent protective film is formed by generation of an ester-reaction of the silane coupling agent.

As described in the above first embodiment, the larger the number of OH groups on the semiconductor substrate W (convex pattern), the higher the water repellency of the semiconductor substrate W (convex pattern) surface becomes. In the present embodiment, with the highly oxidative chemical solution used at the time of the washing treatment in Step S202, the number of OH groups on the semiconductor substrate W (convex pattern) is large.

(Step S206) Alcohol such as IPA is supplied from the IPA supply unit 212 to the vicinity of the rotational center of the semiconductor substrate W surface. Upon receipt of centrifugal force generated by rotation of the semiconductor substrate W, IPA reaches all parts of the semiconductor substrate W surface. Thereby, alcohol rinsing treatment is performed in which the silane coupling agent remaining on the semiconductor substrate W surface is replaced by IPA.

(Step S207) Pure water is supplied from the pure water supply unit 211 to the vicinity of the rotational center of the semiconductor substrate W surface. Upon receipt of centrifugal force generated by rotation of the semiconductor substrate W, the pure water reaches all parts of the semiconductor substrate W surface. Thereby, pure-water rinsing treatment is performed in which the pure water remaining on the semiconductor substrate W surface is replaced by IPA.

(Step S208) The substrate holding/rotation unit 200 increases the rotational speed of the semiconductor substrate W to a predetermined spin dry rotational speed, to perform spin dry treatment in which the pure water remaining on the semiconductor substrate W surface is spun off and dried.

Since the convex pattern on the semiconductor substrate W is covered by the water repellent protective film, a contact angle $\theta$ of pure water is large (close to 90°). Thereby, $\cos \theta$ in above Equation 1 is close to zero and power of the liquid, which acts on the pattern at the time of drying treatment, is small so that collapse of the pattern can be prevented.

(Step S209) The water repelling film removal unit 214 moves down to the vicinity of the semiconductor substrate W. Then, the water repelling film removal unit 214 removes the water repellent protective film formed on the convex pattern surface on the semiconductor substrate W while making the convex pattern remain.

Performing the surface treatment on a semiconductor substrate according to the present embodiment also makes it possible to obtain a similar effect to the effect of the above first embodiment (cf. FIG. 4).

As thus described, forming the semiconductor substrate surface with use of the highly oxidative chemical solution and then forming the water repellent protective film on the substrate surface can prevent collapse of the extra-fine pattern at the time of the drying treatment.

Third Embodiment

Although the number of OH groups on the semiconductor substrate W (convex pattern) is increased by the washing treatment with use of the highly oxidative chemical solution in the above first embodiment, it may be increased by irradiating the substrate surface with UV light after being washed with a normal washing chemical solution to further oxidize the substrate surface.

Figure 7:
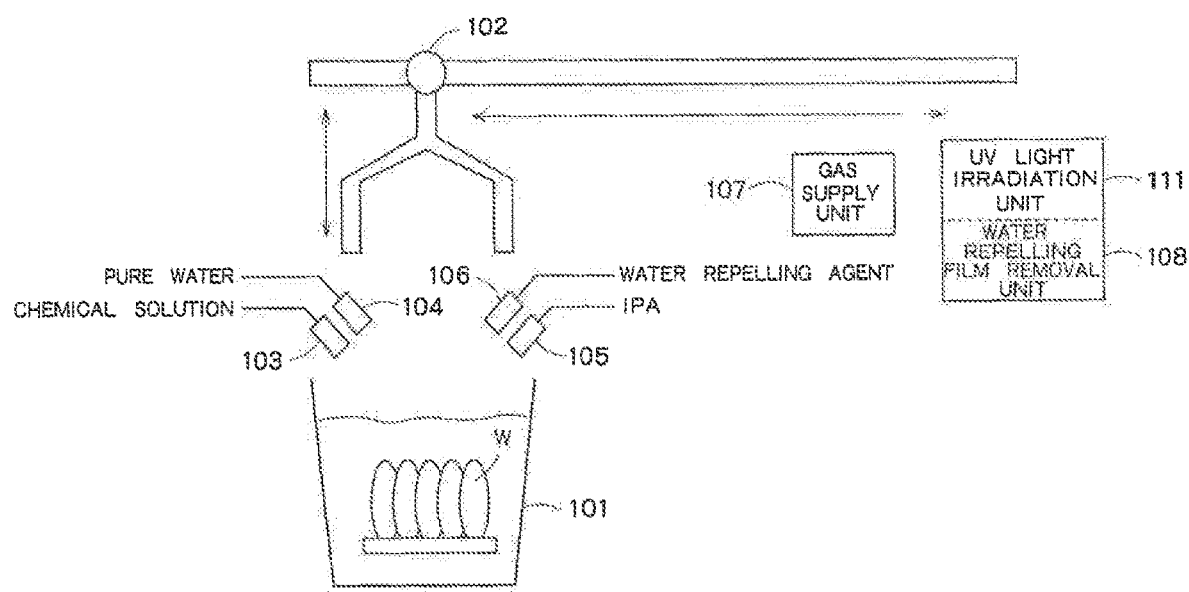
FIG. 7 is a diagram showing a schematic configuration of a surface treatment apparatus of a semiconductor substrate according to a third embodiment of the present invention.

FIG. 7 shows a schematic configuration of a surface treatment apparatus according to the present embodiment. This apparatus is different from the surface treatment apparatus according to the above first embodiment shown in FIG. 1 in that a UV light irradiation unit 111 is provided. Further, the chemical solution supply unit 103 supplies a normal washing chemical solution, such as SPM, SC-1 (Standard Clean 1), or SC-2. The chemical solution supply unit 103 may supply one kind of chemical solution, or may supply a plurality of chemical solutions simultaneously or sequentially. In FIG. 7, the same portions as those in the first embodiment shown in FIG. 1 are provided with the same numerals, and descriptions thereof will not be repeated.

The UV light irradiation unit 111 irradiates the semiconductor substrate inside the processing bath 101 with UV light. The water repelling film removal unit 108 may be the UV light irradiation unit 111. The carrier unit 102 or another movement mechanism, not shown in the figure, carries the UV light irradiation unit 111 above the processing bath 101.

A method for performing surface treatment on a semiconductor substrate with use of such a surface treatment apparatus will be described using a flowchart shown in FIG. 8.

(Step S301) The carrier unit 102 introduces the semiconductor substrate W processed with the convex pattern into the treatment bath 101.

(Step S302) A chemical solution is supplied from the chemical solution supply unit 103 to the treatment bath 101, and the semiconductor substrate W is washed. Thereby, a residue generated due to the processing of the convex pattern on the semiconductor substrate W can be removed.

(Step S303) Pure water is supplied from the pure water supply unit 104 to the treatment bath 101, the semiconductor substrate W is rinsed so that the chemical solution component used in Step S302 is removed.

(Step S304) The UV light irradiation unit 111 is carried above the processing bath 101. The UV light irradiation unit 111 then irradiates the semiconductor substrate W with UV light. Thereby, the substrate surface is further oxidized.

(Step S305) IPA is supplied from the IPA supply unit 105 to the treatment bath 101, and alcohol rinsing treatment is performed in which pure water is replaced by IPA.

(Step S306) A silane coupling agent is supplied from the water repelling agent supply unit 106 to the treatment bath 101, and a protective film with low wettability (water repellent protective film) is formed on the semiconductor substrate W (convex pattern) surface.

As described in the above first embodiment, the larger the number of OH groups on the semiconductor substrate W (convex pattern), the higher the water repellency of the semiconductor substrate W (convex pattern) surface becomes. In the present embodiment, due to the UV light irradiation treatment in Step S304, the number of OH groups on the semiconductor substrate W (convex pattern) is large.

(Step S307) IPA is supplied from the IPA supply unit 105 to the treatment bath 101, and the silane coupling agent is replaced by IPA.

(Step S308) Pure water is supplied from the pure water supply unit 104 to the treatment bath 101, and an IPA residue is rinsed off.

(Step S309) The carrier unit 102 pulls up the semiconductor substrate W from the treatment bath 101, and the gas supply unit 107 supplies the semiconductor substrate W with dry air for evaporation-drying.

Since the pattern formed on the semiconductor substrate W is covered by the water repellent protective film, a contact angle θ of a liquid is large (close to 90°). Liquid force which acts on the pattern at the time of the drying treatment is thus small, and hence collapse of the pattern at the time of drying treatment can be prevented.

(Step S310) The carrier unit 102 carries the semiconductor substrate W to the water repelling film removal unit 108. The water repelling film removal unit 108 removes the water repellent protective film formed on the convex pattern surface on the semiconductor substrate W while making the convex pattern remain.

As thus described, irradiating the semiconductor substrate surface with UV light to promote an oxidation reaction and then forming the water repellent protective film on the substrate surface can prevent collapse of the extra-fine pattern at the time of the drying treatment, as in above first embodiment.

Fourth Embodiment

Although the number of OH groups on the semiconductor substrate W (convex pattern) is increased by the washing treatment with use of the highly oxidative chemical solution in the above second embodiment, it may be increased by irradiating the substrate surface with UV light after being washed with a normal washing chemical solution to further oxidize the substrate surface. The water repelling film removal unit 214 performs UV-light Irradiation.

Figure 9:
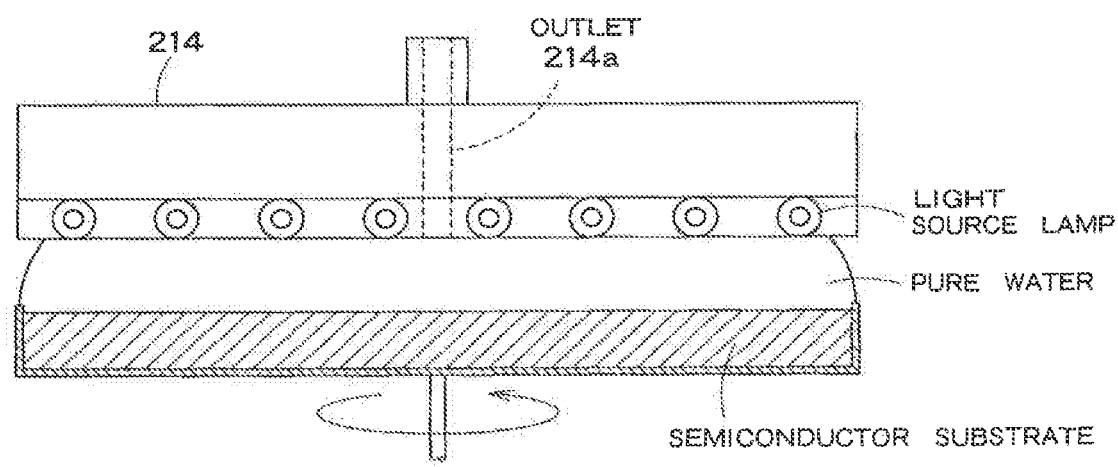
FIG. 9 is a schematic constitutional view of a water repelling film removal unit provided in a surface treatment apparatus for a semiconductor substrate according to a fourth embodiment of the present invention.

The surface treatment apparatus according to the present embodiment has a similar configuration to that of the surface treatment apparatus according to the above second embodiment shown in FIG. 5. However, the water repelling film removal unit 214 needs the semiconductor substrate W surface to be in a wet state at the time of irradiation of the substrate surface with UV light for oxidization. Therefore, as shown in FIG. 9, the water repelling film removal unit 214 includes an outlet 214a for discharging pure water.

Further, the chemical solution supply unit 210 supplies a normal washing chemical solution, such as SPM, SC-1 (Standard Clean 1), or SC-2. The chemical solution supply unit 210 may supply one kind of chemical solution, or may supply a plurality of chemical solutions simultaneously or sequentially.

A method for performing surface treatment on a semiconductor substrate with use of the surface treatment apparatus according to the present embodiment will be described using a flowchart shown in FIG. 10.

(Step S401) A semiconductor substrate W to be treated, having a plurality of convex patterns in a predetermined area of its surface, is carried and held in the substrate holding/rotation unit 200. The convex pattern is, for example, a line-and-space pattern. At least part of the convex pattern may be formed by a silicon-containing film. The convex pattern is formed, for example, by RIE (Reactive Ion Etching) method.

(Step S402) The semiconductor substrate W is rotated at a predetermined rotational speed, and the chemical solution is supplied from the chemical solution supply unit 210 to the vicinity of the rotational center of the semiconductor substrate W surface. Upon receipt of centrifugal force generated by rotation of the semiconductor substrate W, the chemical solution reaches all parts of the semiconductor substrate W surface, and chemical-solution (washing) treatment is performed on the semiconductor substrate W. It is possible by this treatment to remove a residue generated by processing of the convex pattern on the semiconductor substrate W.

(Step S403) Pure water is supplied from the pure water supply unit 211 to the vicinity of the rotational center of the semiconductor substrate W surface. Upon receipt of centrifugal force generated by rotation of the semiconductor substrate W, the pure water reaches all parts of the semiconductor substrate W surface. Thereby, pure-water rinsing treatment is performed in which the chemical solution remaining on the semiconductor substrate W surface is rinsed off by the pure water.

(Step S404) The water repelling film removal unit 214 moves down, and irradiates the semiconductor substrate W surface with UV light while discharging pure water. Thereby, the substrate surface is further oxidized.

(Step S405) Alcohol such as IPA is supplied from the IPA supply unit 212 to the vicinity of the rotational center of the semiconductor substrate W surface. Upon receipt of centrifugal force generated by rotation of the semiconductor substrate W, IPA reaches all parts of the semiconductor substrate W surface. Thereby, alcohol rinsing treatment is performed in which the pure water remaining on the semiconductor substrate W surface is replaced by IPA.

(Step S406) A water repelling agent is supplied from the water repelling agent supply unit 213 to the vicinity of the rotational center of the semiconductor substrate W surface. The water repelling agent is, for example, a silane coupling agent.

Upon receipt of centrifugal force generated by rotation of the semiconductor substrate W, the silane coupling agent reaches all parts of the semiconductor substrate W surface. Thereby, a protective film with low wettability (water repellent protective film) is formed on the convex pattern surface. This water repellent protective film is formed by generation of an ester-reaction of the silane coupling agent.

As described in the above first embodiment, the larger the number of OH groups on the semiconductor substrate W (convex pattern), the higher the water repellency of the semiconductor substrate W (convex pattern) surface becomes. In the present embodiment, due to the UV light irradiation treatment in Step S404, the number of OH groups on the semiconductor substrate W (convex pattern) is large.

(Step S407) Alcohol such as IPA is supplied from the IPA supply unit 212 to the vicinity of the rotational center of the semiconductor substrate W surface. Upon receipt of centrifugal force generated by rotation of the semiconductor substrate W, IPA reaches ail parts of the semiconductor substrate W surface, Thereby, alcohol rinsing treatment is performed in which the silane coupling agent remaining on the semiconductor substrate W surface is replaced by IPA.

(Step S408) Pure water is supplied from the pure water supply unit 211 to the vicinity of the rotational center of the semiconductor substrate W surface. Upon receipt of centrifugal force generated by rotation of the semiconductor substrate W, the pure water reaches all parts of the semiconductor substrate W surface. Thereby, pure-water rinsing treatment is performed in which the pure water remaining on the semiconductor substrate W surface is replaced by IPA.

(Step S409) The substrate holding/rotation unit 200 increases the rotational speed of the semiconductor substrate W to a predetermined spin dry rotation & speed, to perform spin dry treatment in which the pure water remaining on the semiconductor substrate W surface is spun off and dried.

Since the convex pattern on the semiconductor substrate W is covered by the water repellent protective film, a contact angle θ of pure water is large (close to 90°). Thereby, cos θ in above Equation 1 is close to zero and power of the liquid, which acts on the pattern at the time of drying treatment, is small so that collapse of the pattern can be prevented.

(Step S410) The water repelling film removal unit 214 moves down to the vicinity of the semiconductor substrate W. Then, the water repelling film removal unit 214 irradiates the semiconductor substrate W with UV light, to remove the water repellent protective film formed on the convex pattern surface on the semiconductor substrate W while making the convex pattern remain.

Performing the surface treatment on a semiconductor substrate according to the present embodiment also makes it possible to obtain a similar effect to the effect of the above first embodiment (cf. FIG. 4).

As thus described, irradiating the semiconductor substrate surface with UV light to promote an oxidation reaction and then forming the water repellent protective film on the substrate surface can prevent collapse of the extra-fine pattern at the time of the drying treatment.

In the above first to forth embodiments, in the case of the silane coupling agent being replaceable by pure water, it is possible to omit the alcohol rinsing treatment before and after the water repelling treatment.

It is known that, when added with IPA having a hydroxyl group and $H_2O$, the silane coupling agent used for the water repelling treatment undergoes hydrolysis and the water repellent ability decreases. Degradation of the water repellent ability causes reduction in pattern collapse preventing effect.

For this reason, after the pure-water rinsing and the IPA replacement and before the water repelling treatment, thinner treatment may be performed to replace IPA by a thinner not containing a hydroxyl group. As the thinner used can be a solvent having no hydroxyl group in a compound itself, such as toluene, a solvent that does not generate a hydroxyl group as an intermediate product, or cyclohexanone. When the thinner is replaceable by water, the IPA replacement (alcohol rinsing) after the pure-water rinsing may be omitted.

Although the water repelling treatment is performed using the sane coupling agent in the above first to fourth embodiments, a surfactant (aqueous surfactant) may be used. In the case of using the surfactant, the IPA replacement (alcohol rinsing) before and after the water repelling treatment can be omitted, thereby eliminating the need to provide the IPA supply units 105, 212 in the surface treatment apparatus.

Although each of the surface treatment apparatuses according to the first and third embodiments is an overflow type apparatus using a single treatment bath, a plurality of treatment baths respectively reserving a chemical solution, pure water, a water repelling agent, and the like may be provided, and the substrate holding/carrier unit 102 may sequentially soak the semiconductor substrate in the respective baths.

Although the semiconductor substrate is dried using the evaporation-drying method in the above first and third embodiments, a depressurization-drying method, a spin-drying method, or the like may be used. Further, pure water may be replaced by a solvent containing IPA or HFE, and the solvent may be subjected to evaporation-drying.

In the above second and fourth embodiments, the water repelling film removal unit may be provided in each of the plurality of substrate holding/rotation units 200, or one water repelling film removal unit may be made movable above the plurality of substrate holding/rotation units 200.

Although the semiconductor substrate W is irradiated with ultraviolet light so as to be oxidized in the above third and fourth embodiments, another light such as infrared light may be applied.

Ultraviolet-light irradiation for oxidizing the semiconductor substrate W surface may be performed in the middle of the convex pattern processing FIGS. 11A, 11B, 11C, 11D, 12A, 128, 12C show an example of such a surface treatment method.

First, as shown in FIG. 11A, a silicon-based member layer 11, a silicon nitride film 12 and a silicon oxide film 13 are sequentially formed on the semiconductor substrate W. The silicon-based member layer 11 is formed using silicon oxide, polysilicon or the like. The silicon-based member layer 11 may be made up of a plurality of films.

Next, as shown hi FIG. 116, a resist layer 14 having a line-and-space pattern is formed on the silicon oxide film 13 by means of a photolithography technique.

Next, as shown in FIG. 11C, dry etching is performed, to pattern the silicon oxide film 13.

Next, as shown in FIG. 11D, the resist layer 14, is peeled.

Next, as shown in FIG. 12A, dry etching is conducted, to pattern the silicon nitride film 12. Herein, the silicon-based member layer 11 under the silicon nitride film 12 is not processed. Washing is then performed using a chemical solution such as SC-1, SC-2 or SPM, to remove a residue generated due to the dry etching.

Next, as shown in FIG. 126, UV-light irradiation is performed. Therewith, oxidation proceeds on the surface of the silicon oxide film 13, the side faces of the silicon nitride film 12, and the like. It is to be noted that the silicon oxide film 13 may be removed before the UV-light irradiation.

Next, as shown in FIG. 12C, dry etching is conducted, to pattern the silicon-based member layer 11.

To the semiconductor substrate W formed with a convex pattern 15 in the manner as thus described, the surface treatment method according to the above third and fourth embodiments (except for Steps S304, S404) are applied. The side faces of the silicon nitride film 12 has been forcibly oxidized by the UV light irradiation, thereby to facilitate formation of the water repellent protective film and improve a water repellency, thus making it possible to prevent collapse of the extra-fine pattern at the time of the drying treatment.

Figure 13A:
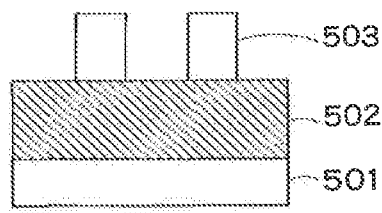
FIG. 13A is a sectional view showing a side-wall transfer process.

Each of the surface treatment apparatuses in the above first to fourth embodiments is suitable for washing/drying of a semiconductor substrate having a convex pattern formed by side-wall transfer process. The side-wall transfer process is performed in such a manner that, as shown in FIG. 13A, first, a second film 502 is formed on a first film 501 formed on a semiconductor substrate (not shown). A resist 503 having a line-and-space pattern is then formed on the second film 502.

Figure 13B:
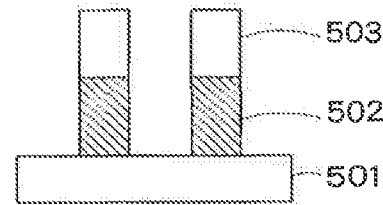
FIG. 13B is a sectional view showing a step subsequent to FIG. 13A.

Next, as shown in FIG. 13B, the second film 502 is etched using the resist 503 as a mask, to transfer the pattern.

Figure 13C:
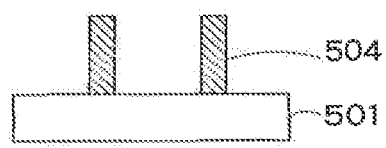
FIG. 13C is a sectional view showing a step subsequent to FIG. 13B.

Next, as shown in FIG. 13C, the second film 502 is subjected to summing treatment, to be reduced in width by the order of one half so as to be processed into core members 504. It is to be noted that the resist 503 is removed before or after the slimming treatment. The slimming treatment is preformed by wetting treatment or drying treatment, or in combination of the wetting treatment and the drying treatment.

Figure 13D:
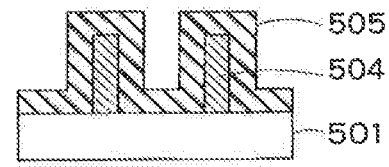
FIG. 13D is a sectional view showing a step subsequent to FIG. 13C.

Next, as shown in FIG. 13D, a third member 505 is formed so as to cover the upper faces and the side faces of the core members 504 by means of CVD (Chemical Vapor Deposition), or the like. The third member 505 is formed of a material capable of taking a large etching selection ratio with respect to the core member 504.

Figure 14A:
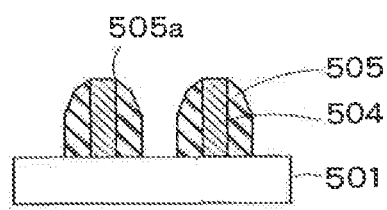
FIG. 14A is a sectional view showing a step subsequent to FIG. 13D.

Next, as shown in FIG. 14A, the third member 505 is dry-etched until the upper face of the core member 504 is exposed. Dry-etching is performed on an etching condition having selectivity with respect to the core member 504. Thereby, the third member 505 remains in the shape of a spacer along the side faces of the core member 504. In the third member 505 that remains at this time, a top end 505a is located in contact with the top of the side face of the core member 504, and an upper side part takes a shape projectingly curved toward the outside of the core member 504.

Figure 14B:
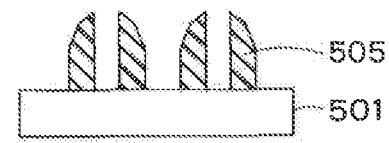
FIG. 14B is a sectional view showing a step subsequent to FIG. 14A.

Next, as shown in FIG. 14B, the core member 504 is removed by wet etching treatment. The third member 505 is formed in an asymmetric shape where spaces with a distance between the tops of adjacent two patterns (opening width size of the space pattern) being small and spaces with the distance being large are alternately present.

Figure 14C:
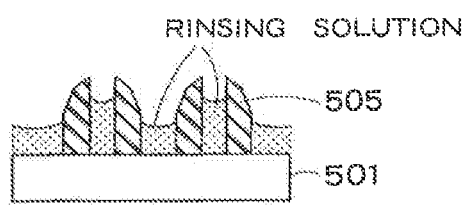
FIG. 14C is a sectional view showing a step subsequent to FIG. 14B.

In the case of washing and drying the pattern in such an asymmetric shape as the third member 505, as shown in FIG. 14C, fluid level lowering speeds of space portions significantly differ, to cause application of large force to the pattern, and it has thus been difficult to prevent collapse of the pattern.

However, with use of the surface treatment apparatuses in the above first to fourth embodiments, even in the case of the pattern in the asymmetrical shape formed by the side-wall transfer process, performing forcible oxidation and water repelling treatment on the pattern surface can lead to washing and drying of the substrate while preventing collapse of the pattern.

Figure 15A:
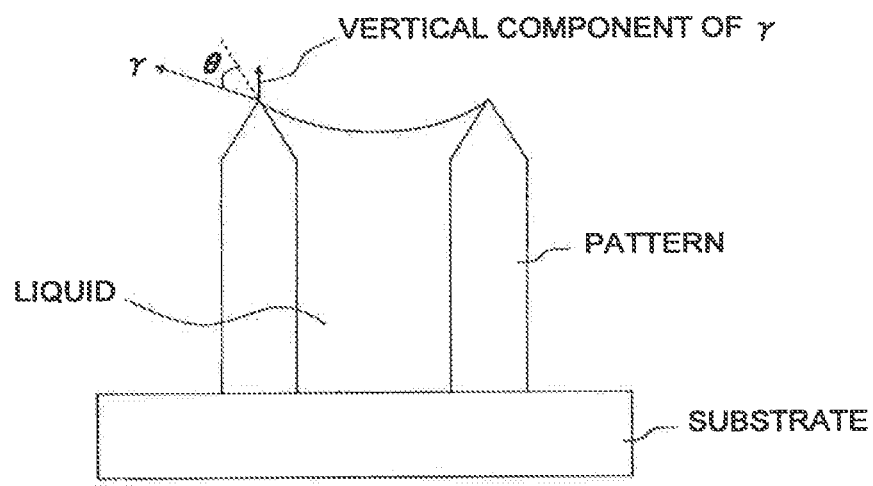
FIG. 15A is a view showing a surface tension of liquid to the pattern.

As seen from above Equation 1 and FIG. 3, the force P applied to the pattern 4 depends on a vertical component of the surface tension γ. Therefore, as shown in FIG. 15A, by making a structure such that the top of the pattern is inclined, namely an angle formed by the side face of the top of the pattern with respect to the substrate surface is different from an angle formed by the side face of the bottom of the pattern with respect to the substrate surface, it is possible to make the vertical component of the surface tension γ small, so as to reduce the force applied to the pattern.

Figure 15B:
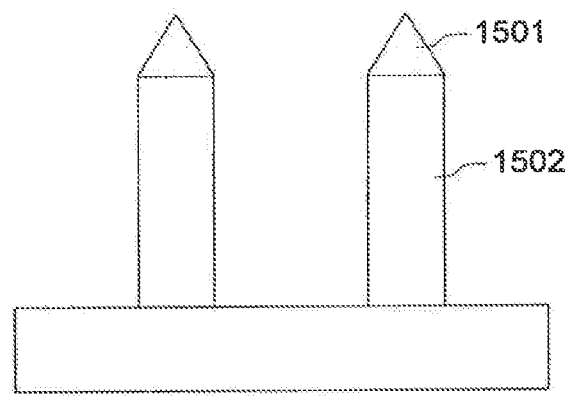
FIG. 15B is a view showing a configuration in which the whole pattern is tilted.

Such a structure can be formed by making a temperature low at the time of performing RIE treatment on the pattern. Further, as shown in FIG. 15B, in a case where the pattern is configured of a mask material 1501 and a pattern material 1502, a similar configuration can be obtained by performing RIE treatment on the condition of a selectivity between the mask material 1501 and the pattern material 1502 being low or on the condition of the selectivity being the same.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:
1. A surface treatment method for a semiconductor substrate, comprising:
   forming a stacked body comprising a silicon nitride film and a silicon oxide film thereon on a silicon substrate containing an OH group;

forming a resist film on the silicon oxide film in the stacked body;
patterning the silicon oxide film by a dry etching;
forming a plurality of convex patterns by peeling the resist film;
washing the surface of the convex patterns with use of a chemical solution;
after the washing, while supplying a pure water on a surface of the silicon substrate, irradiating the surface of the silicon substrate with a UV light, to oxidize the surface of the silicon substrate;
supplying a silane coupling agent on the surface of the silicon substrate to form a water repellent protective film including R—Si—OH on the surface of the convex patterns by a silylation reaction between the OH group of the silicon substrate and R—Si—OH of the silane coupling agent;
rinsing the silicon substrate with use of the pure water after forming the water repellent protective film; and
drying the silicon substrate after the rinsing.

2. The surface treatment method of claim 1,
wherein after forming the repellent protective film, while supplying the pure water on the surface of the silicon substrate, irradiating the surface of the silicon substrate with a UV light to remove the water repellent protective film and to rinse the silicon substrate.

3. The surface treatment method of claim 1,
wherein the resist film is formed as a resist layer comprising a line-and-space pattern on the silicon oxide film with use of a photolithography technique, and the silicon nitride film is formed by patterning by the dry etching of the plurality of convex patterns.

4. The surface treatment method of claim 1,
wherein after washing the surface of the convex patterns with use of the chemical solution, before oxidizing the surface of the silicon substrate, the silicon substrate is rinsed with use of the pure water to remove the chemical solution.

5. The surface treatment method of claim 1,
wherein after oxidizing the surface of the silicon substrate, before forming the water repellent protective film, an IPA is supplied to rinse the surface of the silicon substrate with alcohol.

6. The surface treatment method of claim 1,
wherein after forming the water repellent protective film, before rinsing the silicon substrate with use of the pure water, an IPA is supplied to rinse the surface of the silicon substrate with alcohol.

7. The surface treatment method of claim 1,
wherein the convex patterns are formed by a side-wall transfer process.

8. The surface treatment method for a silicon substrate according to claim 1,
wherein a size of each convex pattern is 30 nm or less; and an aspect ratio of each convex pattern is 10 or more.

9. A surface treatment method for a semiconductor substrate, comprising:
forming a stacked body comprising a silicon nitride film and a silicon oxide film thereon on a silicon substrate containing an OH group;
forming a resist film on the silicon oxide film in the stacked body;
patterning the silicon oxide film by a dry etching;
forming a plurality of convex patterns by peeling the resist film;
washing the surface of the convex patterns with use of a chemical solution while rotating the silicon substrate;
after the washing, while rotating the silicon substrate, supplying a pure water on a surface of the silicon substrate, irradiating the surface of the silicon substrate with a UV light, to oxidize the surface of the silicon substrate;
while rotating the silicon substrate, supplying a silane coupling agent on the surface of the silicon substrate to form a water repellent protective film on the surface of the convex patterns by an ester-reaction of the silane coupling agent;
after forming the water repellent protective film, rinsing the silicon substrate with use of the pure water while rotating the silicon substrate; and
drying the silicon substrate while rotating the silicon substrate after the rinsing.

10. The surface treatment method of claim 9,
wherein the resist film is formed as a resist layer comprising a line-and-space pattern on the silicon oxide film with use of a photolithography technique, and the silicon nitride film is formed by patterning by the dry etching of the plurality of convex patterns.

11. The surface treatment method of claim 9,
wherein after washing the surface of the convex patterns, before oxidizing the surface of the silicon substrate, the silicon substrate is rinsed with use of the pure water to remove the chemical solution.

12. The surface treatment method of claim 9,
wherein after oxidizing the surface of the silicon substrate, before forming the water repellent protective film, an IPA is supplied to rinse the surface of the silicon substrate with alcohol.

13. The surface treatment method for a silicon substrate according to claim 9,
wherein a size of each convex pattern is 30 nm or less; and an aspect ratio of each convex pattern is 10 or more.

14. A surface treatment method for a semiconductor substrate, comprising:
forming a stacked body comprising a silicon nitride film and a silicon oxide film thereon on a silicon substrate containing an OH group;
forming a resist film on the silicon oxide film in the stacked body;
patterning the silicon oxide film by a dry etching;
forming a plurality of convex patterns by peeling the resist film;
washing the surface of the convex patterns with use of a chemical solution;
after the washing, rinsing the silicon substrate with use of a pure water;
after rinsing the silicon substrate with use of the pure water, irradiating a light to forcibly oxidize the surface of the convex patterns including a side surface of the silicon nitride film and the surface of the silicon oxide film;
supplying a silane coupling agent on the surface of the silicon substrate to form a water repellent protective film including R—Si—OH on the surface of the convex patterns by a silylation reaction between the OH group of the silicon substrate and R—Si—OH of the silane coupling agent;
after forming the water repellent protective film, rinsing the silicon substrate with use of the pure water; and
drying the silicon substrate after the rinsing,
wherein gaps between two convex patterns adjacently disposed among the convex patterns vary one another at a tip side of the convex patterns; and each of the convex patterns comprises a first side surface having a first angle to the surface of the silicon substrate and a second side surface that are connected to the first side surface and has a second angle smaller than the first angle to the surface of the silicon substrate, the first side surface being disposed at a side nearer to the surface of the silicon substrate than the second side surface.

15. The surface treatment method of claim 14, wherein the resist film as a resist layer comprising a line-and-space pattern on the silicon oxide film with use of a photolithography technique, and the silicon nitride film is formed by patterning by the dry etching of the plurality of convex patterns.

16. The surface treatment method of claim 14, wherein after washing the surface of the convex patterns, before oxidizing the surface of the silicon substrate, the silicon substrate is rinsed with use of the pure water to remove the chemical solution.

17. The surface treatment method of claim 14, wherein after oxidizing the surface of the silicon substrate, before forming the water repellent protective film, an IPA is supplied to rinse the surface of the silicon substrate with alcohol.

18. The surface treatment method of claim 14, wherein after forming the water repellent protective film, before rinsing the silicon substrate with use of the pure water, an IPA is supplied to rinse the surface of the silicon substrate with alcohol.

19. The surface treatment method of claim 14, wherein the convex patterns are formed by a side-wall transfer process.

20. The surface treatment method for a silicon substrate according to claim 14, wherein a size of each convex pattern is 30 nm or less; and an aspect ratio of each convex pattern is 10 or more.

* * * * *

UNITED STATES PATENT AND TRADEMARK OFFICE
CERTIFICATE OF CORRECTION

PATENT NO. : 10,573,508 B2  
APPLICATION NO. : 14/836881  
DATED : February 25, 2020  
INVENTOR(S) : Tatsuhiko Koide et al.

Page 1 of 1

It is certified that error appears in the above-identified patent and that said Letters Patent is hereby corrected as shown below:

In the Claims

Claim 15, Column 17, Line 10, change "wherein the resist film as a resist layer comprising a" to --wherein the resist film is formed as a resist layer comprising a--.

Signed and Sealed this  
Twenty-ninth Day of December, 2020

Andrei Iancu  
*Director of the United States Patent and Trademark Office*